(12) United States Patent
Anderson et al.

(10) Patent No.: US 7,026,807 B2
(45) Date of Patent: Apr. 11, 2006

(54) POWER MEASUREMENT SYSTEM

(75) Inventors: Alan Anderson, Edinburgh (GB); Eric Breakenridge, Clackmannanshire (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/758,916

(22) Filed: Jan. 16, 2004

(65) Prior Publication Data

US 2004/0150389 A1 Aug. 5, 2004

(30) Foreign Application Priority Data

Jan. 31, 2003 (EP) ................................. 03250612

(51) Int. Cl.
*G01R 31/00* (2006.01)

(52) U.S. Cl. .................. 324/158.1; 324/73.1

(58) Field of Classification Search .................. 324/74, 324/95, 158.1, 73.1; 702/60, 85
See application file for complete search history.

(56) References Cited

U.S. PATENT DOCUMENTS

| 4,335,349 A | * | 6/1982 | Baldock et al. ............. 324/601 |
| 5,204,614 A | * | 4/1993 | Szente et al. ................. 324/95 |
| 5,373,237 A |  | 12/1994 | Imperato |
| 5,463,310 A | * | 10/1995 | Pegg et al. .................... 324/95 |
| 6,154,682 A |  | 11/2000 | Yi |

\* cited by examiner

*Primary Examiner*—Vinh P. Nguyen

(57) ABSTRACT

A power meter is provided in which calibration is carried out as an automated procedure controlled by the meter.

10 Claims, 3 Drawing Sheets

POWER MEASUREMENT SYSTEM

TECHNICAL FIELD

The present invention relates to a power meter and sensor apparatus of the type used, for example, in a system for measuring the power of Radio Frequency (RF) signals. In particular the present invention relates to a system for measuring the power of RF signals that offers increased measurement confidence and instrumentation accuracy in a manner that is convenient to the user of the system.

BACKGROUND ART

Standard RF power measuring systems used for testing RF equipment during manufacture, installation and maintenance comprise a meter unit coupled to a sensor unit by a cable. Typically, the sensor unit comprises a sensing element that converts RF power to an equivalent voltage or current signal. The sensing element is typically a diode or a thermocouple. The voltage or current signal can be amplified and conditioned, for example, so that the meter unit can provide an indication of power.

In order to ensure measurement traceabilty to national standards, the above type of RF power measurement system needs to be calibrated. In this respect, there are two types of calibration procedures commonly performed: factory calibration and user calibration.

Factory calibration is either performed during manufacture or at periodic calibration intervals (typically one year) when the meter unit, the sensor unit and the cable are returned to the factory for calibration. The sensor unit is calibrated against a transfer standard at a number of frequency points to determine calibration factors for the sensor unit. A calibration factor represents the combination of efficiency of the sensor element and mismatch loss (a measure of coupling efficiency of a source of RF power with an input of the sensor unit) at a particular frequency, and is applied after measurement, by the meter unit as a correction to the measurement. The meter unit is also calibrated in order to maintain linearity of measurements by the system, due to the sensing element being a non-linear device. Additionally, the meter unit is usually provided with a reference power source, the reference power source being set using a transfer standard.

Whilst the factory calibration is needed, it is not uncommon for a different meter unit/cable/sensor unit combination to be used throughout the working life of the meter unit. Consequently, a need exists to calibrate for a particular meter unit/cable/sensor unit combination and this is known to be done by a user of the meter unit.

During normal use, the sensor unit is attached to the meter unit by the cable. Offsets present in readings given by the meter unit when no input RF signal is present are then removed from the measurement system by an offset removal procedure automated by the meter unit (normally referred to as zeroing or auto-zero). The meter unit and sensor unit gains are considered as a single "path gain" and so the system can measure absolute power by disconnecting the sensor unit from a device under test, attaching the sensor unit to the reference source and performing an automated calibration procedure provided with the meter unit. Since the meter unit knows the power of the reference source being applied, a gain factor of the meter unit can be adjusted by the meter unit to ensure that the correct value of the power of the reference source, taking into account the path gain, is displayed. The sensor unit is then reattached to the device under test and absolute power of a signal being generated by the device under test can be measured and displayed by the meter unit. If the frequency of the measured signal is different from the frequency of the reference source, then the calibration factor of the sensor unit for the frequency of the measured signal should be manually entered into the meter unit, from hard-copy information provided with the power measuring system, to ensure the meter unit displays the correct power.

Over time, the sophistication of power measurement systems has increased to the point now that it is possible to store the calibration factors in Electronically Erasable Programmable Read Only Memories (EEPROMs) resident in the sensor unit and readable by the meter unit. Additionally, sensing elements of the diode type can now be operated beyond an inherent operating range where power is converted to current or voltage in a linear manner. The ability to operate the diode in this way is made possible by the provision of a further stage in the factory calibration procedure of the sensor unit. The further stage requires the sensor unit to be subjected to a number of known RF power levels, typically at the same frequency of the reference source, and the response of the sensor unit is measured and stored in the EEPROM. The meter unit then uses this data when the sensor unit is connected to a device under test to produce a correction function that linearises the output of the sensor unit, and thus enables wider dynamic range measurements. The calibration data including the above-mentioned calibration factors relating to the sensor unit are stored in the EEPROM as data expressed in relative terms with respect to the measured output power of the reference source, so that linearity and frequency calibration of the sensor unit by the user can take place.

An additional advance in this field is the provision of a temperature sensing element within the sensor unit. Since the current flowing through the sensing element can be influenced by the temperature of the sensing element, by measuring the temperature of the sensing element, it is possible to apply a correction for variations in temperature in respect of power measurements made using the sensor unit. Some factory calibration procedures for sensor units involve the measurement of temperature variations with respect to the sensor unit, such data also being stored in the EEPROM.

With respect to the user calibration procedure, as mentioned above, the user must regularly disconnect the sensor unit from the device under test and connect the sensor unit to the reference source of the meter unit. After calibration, the user must then reconnect the sensor unit to the device under test. During this partly manual procedure, measurement errors can arise if the reference source is not mechanically connected efficiently to the sensor unit. Further, the user calibration procedure is inconvenient and relies on an RF source, with associated mismatch uncertainties, to measure what is predominantly a DC circuit (referred to here as the path gain calibration). Additionally, during the user calibration procedure, it is assumed that the extensive characterisation implemented during the factory calibration procedure is still valid, and so the user calibration procedure is, effectively, only testing the general integrity of the power measuring system and the path gain characterisation from the output of the sensor unit to acquisition circuitry of the meter unit.

As a way of mitigating the above-described disadvantages, alternative designs for power measurement systems have been developed. These designs employ so-called 'no-cal' solutions that remove the need for the user to perform the disconnections and reconnections of the user calibration procedure. Consequently, in an attempt to reduce the number of variable components making up the power measurement system, one known type of power measurement system has the cable permanently coupled to a characterised sensor unit, thereby reducing the number of independent component combinations constituting the power measurement system.

It therefore follows that the above 'no-cal' solution for power measurement systems is not capable of allowing changes of cables by the user, as may occur when a cable supplied at manufacture subsequently becomes damaged. Some other no-cal solutions restrict the ability of the user to change the cable. Also, such solutions do not allow for internal components that experience wear or ageing, thereby compromising the accuracy of the power measurement. Thus, known power measurement systems and associated calibration techniques are not entirely satisfactory from the standpoint of accuracy or execution. A need therefore exists for a power measurement system that makes more accurate measurements than the traditional approach yet is without the intrusive requirement of disconnecting and connecting the sensor unit from and to the device under test.

DISCLOSURE OF INVENTION

According to a first aspect of the present invention, there is provided a power measurement system for measuring power of an electromagnetic signal, the system comprising: a measuring unit for translating an electrical signal originating from a sensor into a power measurement; a sensor unit comprising the sensor and an amplification circuit; a cable for coupling the measuring unit to the sensor unit, the sensor unit and the cable defining a path for communicating the electrical signal originating from the sensor to the measuring unit; and a source of a reference signal capable of being tapped into the path in order to communicate the reference signal to the measuring unit.

The source of the reference signal may be arranged to be coupled to the amplification circuit in place of the sensor.

The source of the reference signal may be arranged to be coupled to the amplification circuit in addition to the sensor as a stimulus to the sensor.

The source of the reference signal may be arranged to generate a fixed reference signal. Alternatively, or additionally, the reference signal is capable of being varied in amplitude to characterise the sensor.

The reference signal may be a Direct Current (DC) signal.

The sensor unit may further comprise a temperature dependent component for providing an indication of the temperature within the sensor unit.

According to a second aspect of the present invention, there is provided a sensor unit apparatus for a power measurement system, the apparatus comprising: a sensor; an amplification circuit coupled to the sensor; and a source of a reference signal capable of being coupled to the amplification circuit for communicating the reference signal to a measuring unit via a cable.

The source of the reference signal may be arranged to be coupled to the amplification circuit in place of the sensor.

The source of the reference signal may be arranged to be coupled to the amplification circuit in addition to the sensor as a stimulus to the sensor.

The source of the reference signal may be arranged to generate a fixed reference signal. Alternatively, or additionally, the reference signal is capable of being varied in amplitude to characterise the sensor.

The apparatus may further comprise a temperature dependent component for providing an indication of the temperature within the sensor unit apparatus.

The reference signal may be a Direct Current (DC) signal.

According to a third aspect of the present invention, there is provided a method of maintaining accuracy of a power measurement system comprising a sensor unit coupled to a meter unit by a cable, the method comprising the steps of: generating a test signal; receiving the test signal at the meter unit via a path defined by the sensor unit, the cable and the meter unit; and calibrating the meter unit in response to the test signal; the test signal being a reference signal tapped into the path.

It is thus possible to provide a sensor unit apparatus, a power measurement system and a method of maintaining accuracy of the power measurement system that provide increased measurement confidence, instrumentation accuracy and user convenience and allow accurate DC path gain calculation to take place on a per meter unit basis. The provision of an in-built reference signal that can be switched into the measurement path to establish the path gain allows path gain calibration to be carried out as an automated procedure controlled by the meter unit in a manner completely transparent to a user. The path gain calibration is also independently verifiable with a degree of accuracy not afforded by current systems and methods. The ability to switch a reference signal into the measurement path in order to provide sensing element stimulus also permits verification of correct operation of the sensing element from a response by the sensing element to the reference signal stimulus. By varying the reference signal stimulus, a more sensitive indication of the transfer characteristics of the sensing element, and hence an improved verification of the correct operation of the sensing element, can be achieved than by current systems and methods. It is thus possible to verify that the sensor unit is functioning correctly and certain characteristics of the sensing element have not altered over time. A limitation, inherent in many current power measurement systems, especially those of the "no-cal" variety is thereby overcome. Again, the verification of the sensing element transfer characteristics can be achieved as an automated procedure controlled by the meter unit and transparent to the user.

A further benefit of the present invention is the ability to disconnect the sensing element from an amplifier of the sensor unit, thereby allowing the meter unit to perform an automatic measurement-offset removal procedure whilst the sensor unit is coupled to the device under test.

Accurate absolute thermistor measurements that are repeatable for different meter units is also made possible as the internal reference source can be used to calibrate the thermistor measurement path. The above advantages therefore make it possible for the sensor unit, the cable and the meter unit to be supplied separately, rendering the power measurement system very flexible in terms of allowing the user to replace one or more parts of the system whilst retaining confidence in the accuracy of measurement of the system, and without the need to connect the sensor to an external source of RF power.

BRIEF DESCRIPTION OF DRAWINGS

At least one embodiment of the invention will now be described, by way of example only, with reference to the accompanying drawings, in which.

DETAILED DESCRIPTION

Figure 1:
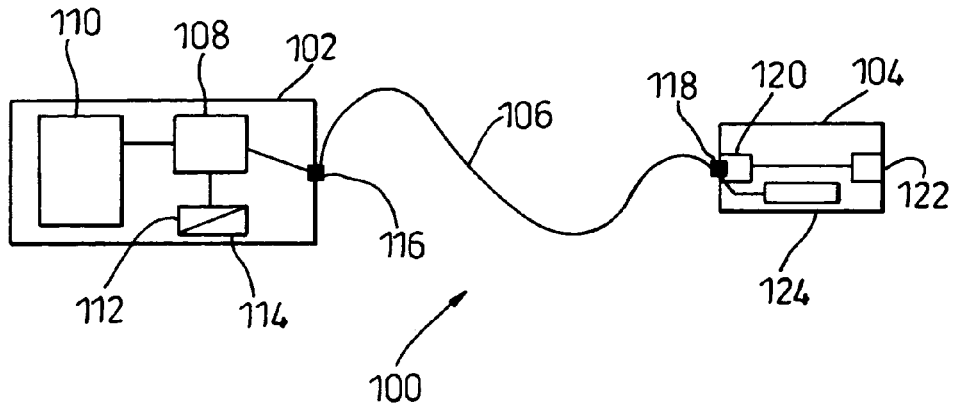
FIG. 1 is a schematic diagram of a power measurement system.

Throughout the following description, identical reference numerals will be used to identify like parts.

Referring to FIG. 1, a power measurement system 100 comprises a meter unit 102 coupled to a sensor unit 104 via a cable 106. The meter unit 102 comprises a microprocessor 108 coupled to a display 110, a volatile memory 112, for example a Random Access Memory (RAM), and a non-volatile memory 114, for example a Read Only Memory (ROM).

The meter unit 102 also comprises an input/output port 116 to which a first end of the cable 106 is coupled. The meter unit 102 is a meter unit designed to work with specific types of sensor units and cables.

The sensor unit 104 comprises an output port 118 having a plurality of terminals. One of the plurality of terminals is a detected signal output pin (not shown in FIG. 1) coupled to an amplification circuit 120, the amplification circuit 120 being coupled to a sensor 122, for example, a zero biased diode. An EEPROM 124 is also coupled to one of the plurality of terminals of the output port 118, namely an EEPROM pin (not shown in FIG. 1), the EEPROM 124 storing characteristics of the sensor 122.

Figure 2:
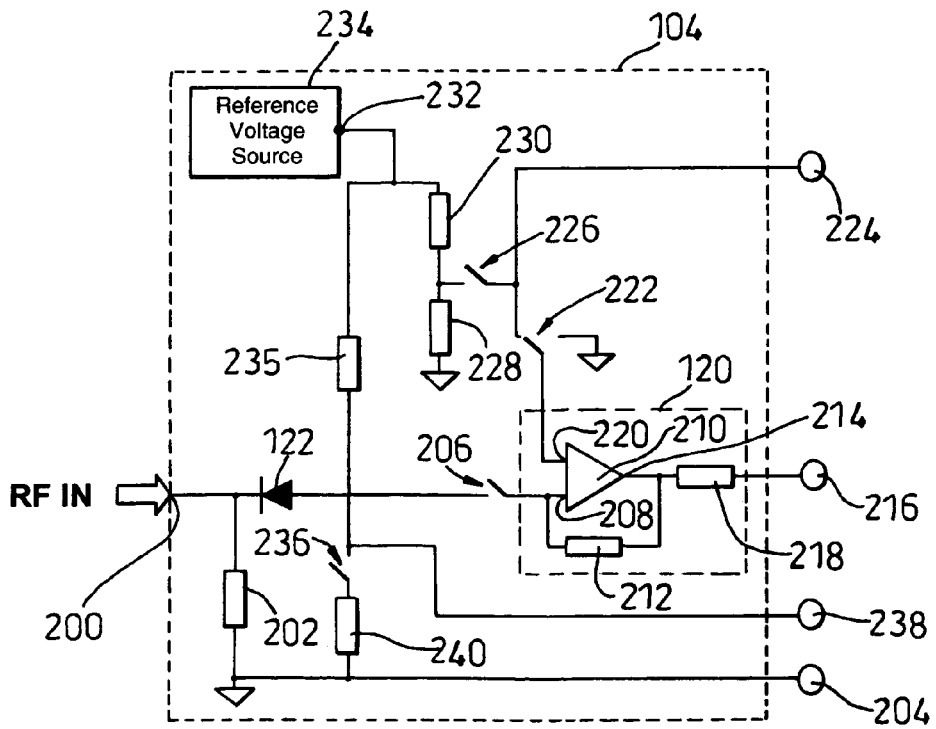
FIG. 2 is a circuit diagram of a sensor unit of FIG. 1.

Referring to FIG. 2, the sensor unit 104 comprises an input port 200 to which a source of RF power to be measured is coupled. The input port 200 is coupled to a cathode of the diode 122 and a first terminal of a first resistor 202, a second terminal of the first resistor 202 being coupled to a ground pin 204 of the output port 118. An anode of the diode 122 is coupled to a first terminal of a first electronically controllable switch 206, a second terminal of the first switch 206 being coupled to an inverting terminal 208 of a transimpedance amplifier (TIA) 210. The inverting terminal 208 of the TIA 210 is coupled to a first terminal of a feedback resistor 212, a second terminal of the feedback resistor 212 being coupled to an output terminal 214 of the TIA 210. The output terminal 214 of the TIA 210 is also coupled to the detected signal output pin 216 via an output resistor 218.

A non-inverting input terminal 220 of the TIA 210 is coupled to a first terminal of an electronically controllable two-way switch 222. A second terminal of the two-way switch 222 is coupled to the ground pin 204 and a third terminal of the two-way switch 222 is coupled to a variable input voltage pin 224 of the output port 118 and a first terminal of a second electronically controllable switch 226. A second terminal of the second switch 226 is coupled to a first terminal of a second resistor 228 and a first terminal of a third resistor 230, the second and third resistors constituting a voltage divider. A second terminal of the second resistor 228 is coupled to the ground pin 204 and a second terminal of the third resistor 230 is coupled to an output terminal 232 of a fixed reference voltage source 234. The fixed reference voltage source 234 can be any suitable circuit known in the art capable of generating a fixed voltage signal.

The output terminal 232 is also coupled to a first terminal of a fourth resistor 235, a second terminal of the fourth resistor 235 being coupled to a first terminal of a third electronically controllable switch 236 and a thermistor output pin 238 of the output port 118. A second terminal of the third switch 236 is coupled to a first terminal of a thermally dependent component, such as a thermistor 240, a second terminal of the thermistor 240 being coupled to the ground pin 204.

In operation, the power measurement system 100 is assembled by coupling the meter unit 102 to the sensor unit 104 using the cable 106.

Figure 3:
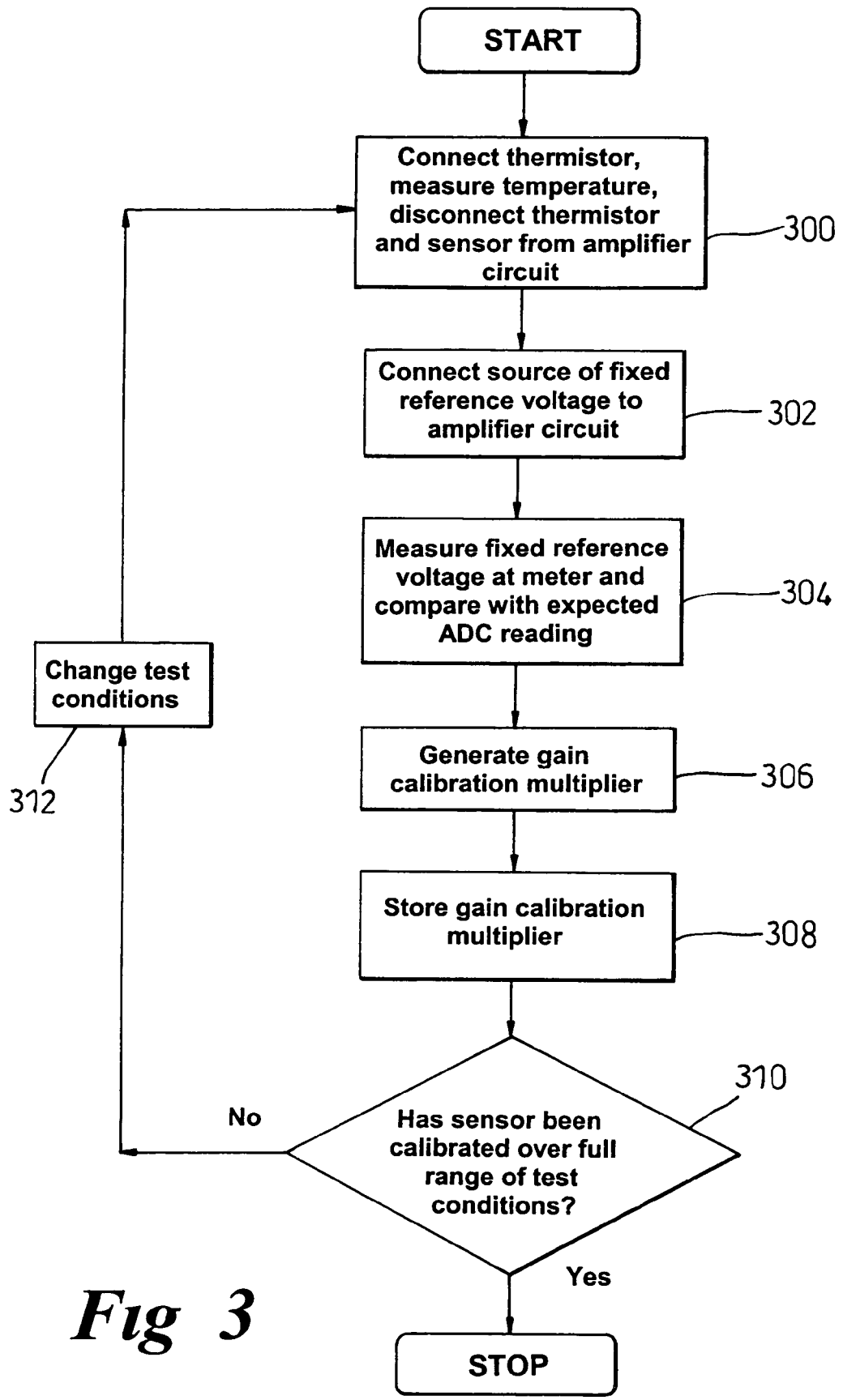
FIG. 3 is a flow diagram of a calibration process for the circuit of FIG. 2.

Referring to FIG. 3, the meter unit 102 is placed into an internal calibration mode, for example, by selecting the calibration mode using a Graphical User Interface (GUI) (not shown) present by the display 110.

Upon entering the calibration mode, the meter unit 102 downloads calibration data from the EEPROM 124. In this example, the EEPROM 124 stores transfer characteristics of the sensor 122 from RF down to DC volts measured over an RF power level range, an RF frequency range and a temperature range for RF testing. Additionally, the EEPROM 124 stores the measured voltage of the voltage generated by the fixed reference voltage source 234, and the transfer characteristics of the sensor 122 from DC voltage signals applied at the variable input voltage pin 224 over a DC voltage level range and a temperature range.

Once the calibration data has been downloaded from the EEPROM 124, an internal calibration procedure is executed and comprises the meter unit 102, by means of the processor 108, actuating, if necessary, the third switch 236 so as to couple (step 300) the thermistor 240 to the fixed reference voltage source 234 via the fourth resistor 235. Once coupled to the fixed reference voltage 234, the voltage across the thermistor 240 constitutes a temperature measurement. The temperature measurement is stored by the processor 108 in the RAM 112 and then the processor actuates the third switch 236 to disconnect (step 300) the thermistor 240. The processor 108 also then actuates, if necessary, the first switch 206 so as to disconnect (step 300) the sensor 122 from the inverting input terminal 208 of the TIA 210. The processor 108 also actuates, if necessary, the two-way switch 222 and the second switch 226 to couple (step 302), the voltage divider formed by the second and third resistors 228, 230 to the non-inverting input terminal 220 of the TIA 210. Consequently, a proportion of the voltage generated by the fixed reference voltage source 234 is applied to the non-inverting input terminal 220 of the TIA 210, the proportion of the voltage generated by the fixed reference voltage source 234 being in accordance with the ratio of the values of the second and third resistors 228, 230. The proportion of the voltage generated by the fixed reference voltage source 234 is measured (step 304) by the meter unit 102, i.e. after experiencing path gain, the path gain being a factor that characterises changes in amplitude experienced by a given signal over a given path, such as those changes due to conversion of the given signal and losses experienced by the given signal. Typically, as in this example, path gain is caused by the amplification circuit 120, the cable 106, gain of the meter, and conversion of a received analogue signal by the meter unit 102 to the digital domain by an Analogue-to-Digital Converter (ADC—not shown).

The measured proportion of the voltage generated by the fixed reference voltage source 234 is compared (step 304) with the expected fixed reference voltage downloaded from the EEPROM 124. A gain calibration multiplier is then calculated (step 306) by the processor 108 based upon any difference between the expected fixed reference voltage and the measured proportion of the voltage generated by the fixed reference voltage source 234. The calculated correction multiplier is then stored (step 308) in the RAM 112 for path gain adjustment of measurements subsequently made by the power measurement system 100.

It should be appreciated that the meter unit 102 comprises a meter gain setting and the sensor unit 104 comprises a sensor gain setting. Consequently, once the gain calibration multiplier has been stored, the processor 108 then determines (step 310) whether or not the sensor unit 104 has been calibrated over a full range of test conditions, for example, for different meter gain settings and different sensor gain settings. If the processor 108 determines (step 310) that the sensor unit 104 has not been calibrated over the full range of test conditions, the processor 108 alters (step 312) the test conditions, for example, the sensor gain setting and repeats the above-described steps 300 to 310. Alternatively, if the processor 108 determines (step 310) that the sensor unit 104 has been calibrated over the full range of test conditions, the calibration procedure is completed.

It should be appreciated that temperature can be another test condition over which the sensor unit 104 can be calibrated, and consequently the thermistor 240 can be used to provide further regular temperature measurements as required for this purpose.

Figure 4:
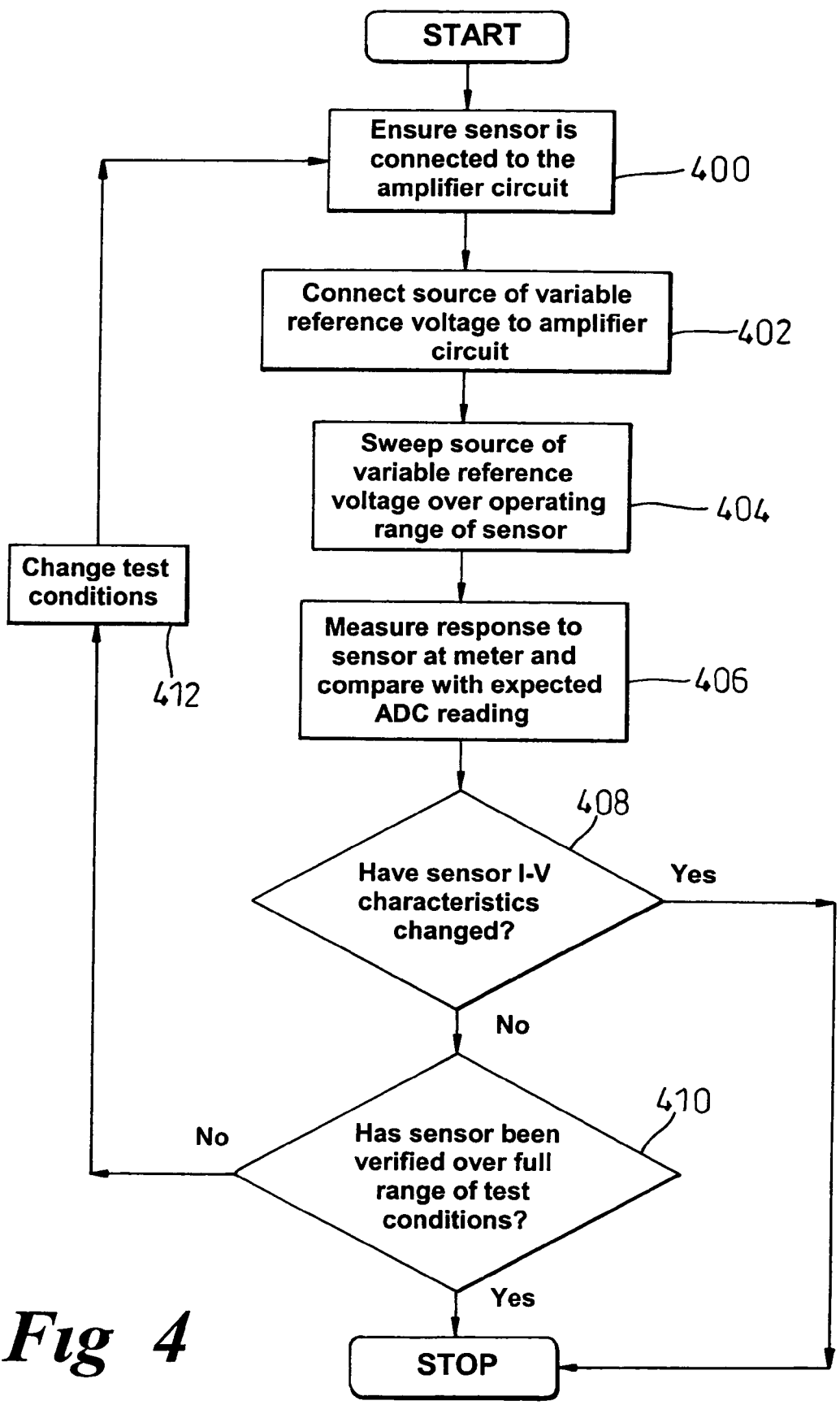
FIG. 4 is a flow diagram of a sensor verification process for the circuit of FIG. 2.

Referring to FIG. 4, a sensor verification procedure can be employed in addition to or instead of the internal calibration procedure. In the sensor verification procedure, the processor 108 actuates, if necessary, the third switch 236 so as to ensure that the third switch 236 is closed and a temperature measurement is made by measuring the voltage across the ground pin 204 and the thermistor output pin 238. The processor 108 then, if necessary, actuates the first switch 206 to ensure (step 400) that the first switch 206 is closed and the sensor 122 is coupled to the inverting input terminal 208 of the TIA 210. Additionally, the processor 108 actuates, if necessary, the second switch 226 and the two-way switch 222 to disconnect the voltage divider from, and connect (step 402) the variable input voltage pin 224 to, the non-inverting input pin 220 of the TIA 210.

Once the above connections and disconnections have been effected, the processor 108 applies a first of a range of DC voltages across the variable input voltage pin 224 and the ground pin 204, and then sweeps (step 404) through the range of DC voltages. The meter unit 102 measures (step 406) the response of the sensor 102 by measuring the voltage applied across the sensor 122 and compares the measured voltage applied across the sensor 122 with the actual voltage applied across the sensor 122. As a result of the above comparison, the I–V characteristics of the sensor 122 are determined and are compared with the expected I–V characteristics, obtain from the EEPROM 124, of the sensor 122 at the measured temperature. By comparing the measured I–V characteristics of the sensor 122 with the expected I–V characteristics thereof, the processor 108 can determine (step 408) if the I–V characteristics of the sensor 122 have changed and therefore determine that the sensor 122 is no longer fit for carrying out measurements, for example, RF power measurements. If it is determined that the sensor 122 is no longer fit for measurement, the sensor verification procedure is deemed completed.

If the sensor 122 is considered still to be operating within acceptable limits, the processor 108 then verifies (step 410) that the sensor 122 has been verified over the full ranges of test conditions, the nature of which have already been described above in relation to the first calibration procedure. If the sensor has been verified over the full ranges of test conditions, the sensor verification procedure is deemed completed. However, if, for example, the sensor 122 has not yet been calibrated over the full range of temperatures over which the measurement system 100 is to operate, the test conditions are altered (step 412) as described above and the above-described steps 400 to 412 of the sensor verification process are repeated.

What is claimed is:

1. A power measurement system for measuring power of an electromagnetic signal, the system comprising:
    a measuring unit for translating an electrical signal originating from a sensor into a power measurement;
    a sensor unit comprising the sensor and an amplification circuit;
    a cable for coupling the measuring unit to the sensor unit, the sensor unit and the cable defining a path for communicating the electrical signal originating from the sensor to the measuring unit; and
    a reference source that generates a reference signal arranged to be selectively coupled to the amplification circuit in at least one of the following configurations:
        coupled to the amplification circuit in place of the sensor; and
        coupled to the amplification circuit in addition to the sensor to provide a stimulus to the sensor via the amplification circuit.

2. A system as claimed in claim 1, wherein the reference signal is a Direct Current (DC) signal.

3. A system as claimed in claim 1, wherein the sensor unit further comprises a temperature dependent component for providing an indication of the temperature within the sensor unit.

4. A system as claimed in claim 1, wherein the reference source is arranged to be selectively coupled to the amplification circuit in addition to the sensor to provide a stimulus to the sensor via the amplification circuit, and the reference signal is varied in amplitude to characterise the sensor.

5. A sensor unit apparatus for a power measurement system, the apparatus comprising:
    a sensor;
    an amplification circuit coupled to the sensor; and
    a reference source that generates a reference signal arranged to be selectively coupled to the amplification circuit for communicating the reference signal to a measuring unit via a cable in at least one of the following configurations:
        coupled to the amplification circuit in place of the sensor; and
        coupled to the amplification circuit in addition to the sensor to provide a stimulus to the sensor via the amplification circuit.

6. An apparatus as claimed in claim 5, wherein the reference source is arranged to generate a fixed reference signal.

7. An apparatus as claimed in claim 5, further comprising a temperature dependent component for providing an indication of the temperature within the sensor unit apparatus.

8. An apparatus as claimed in claim 5, wherein the reference signal is a Direct Current (DC) signal.

9. An apparatus as claimed in claim 5, wherein the reference source is arranged to be selectively coupled to the amplification circuit in addition to the sensor to provide a stimulus to the sensor via the amplification circuit, and the reference signal is varied in amplitude to characterise the sensor.

10. A method of maintaining accuracy of a power measurement system comprising a sensor unit coupled to a meter unit by a cable, the method comprising the steps of:
    generating a test signal;
    receiving the test signal at the meter unit via a path defined by the sensor unit, the cable and the meter unit; and
    calibrating the meter unit in response to the test signal;
    the test signal being a reference signal that is arranged to be selectively coupled in at least one of the following configurations:
        coupled into the path in place of the sensor; and
        coupled into the path in addition to the sensor to provide a stimulus to the sensor via an amplification circuit.

* * * * *